(12) United States Patent
Parikh

(10) Patent No.: US 11,049,770 B2
(45) Date of Patent: Jun. 29, 2021

(54) METHODS AND APPARATUS FOR FABRICATION OF SELF ALIGNING INTERCONNECT STRUCTURE

(71) Applicant: APPLIED MATERIALS, INC., Santa Clara, CA (US)

(72) Inventor: Suketu A. Parikh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/827,814

(22) Filed: Mar. 24, 2020

(65) Prior Publication Data

US 2020/0303254 A1     Sep. 24, 2020

Related U.S. Application Data

(60) Provisional application No. 62/822,923, filed on Mar. 24, 2019.

(51) Int. Cl.
*H01L 21/768* (2006.01)
*H01L 21/3213* (2006.01)

(52) U.S. Cl.
CPC .. *H01L 21/76897* (2013.01); *H01L 21/32136* (2013.01); *H01L 21/76816* (2013.01); *H01L 21/76883* (2013.01)

(58) Field of Classification Search
CPC combination set(s) only.
See application file for complete search history.

(56) References Cited

U.S. PATENT DOCUMENTS

| | | | |
|---|---|---|---|
| 6,352,917 B1* | 3/2002 | Gupta | H01L 21/76831 438/622 |
| 6,940,170 B2 | 9/2005 | Parikh | |
| 9,269,590 B2 | 2/2016 | Luere et al. | |
| 9,437,479 B2 | 9/2016 | Parikh et al. | |
| 2003/0148618 A1* | 8/2003 | Parikh | H01L 21/76849 438/694 |
| 2006/0235563 A1 | 10/2006 | Parikh et al. | |
| 2016/0099174 A1* | 4/2016 | Wu | H01L 21/76808 438/618 |
| 2017/0004996 A1* | 1/2017 | Briggs | H01L 23/5226 |
| 2018/0130707 A1* | 5/2018 | Clendenning | H01L 21/28556 |
| 2018/0261507 A1* | 9/2018 | Jacobi | H01L 29/4958 |

* cited by examiner

*Primary Examiner* — Mamadou L Diallo
(74) *Attorney, Agent, or Firm* — Moser Taboada

(57) ABSTRACT

Methods and apparatus for forming an interconnect structure, including: depositing a plurality of spacers atop a low-k dielectric layer including a plurality of recessed vias, wherein one or more of the plurality of spacers is deposited atop the top surface of the low-k dielectric layer and within one or more of the plurality of recessed vias to form a one or more partially filled recessed vias; depositing a conformal metal layer atop the low-k dielectric layer, plurality of spacers, and within the one or more partially filled recessed vias to form a plurality of filled vias; etching the conformal metal layer to remove portions thereof to form a second plurality of partially filled recessed vias; and filling between the plurality spacers and within the second plurality of partially filled recessed vias with a dielectric material to form a second plurality of filled vias.

20 Claims, 12 Drawing Sheets

100

---

DEPOSITING A FIRST SPACER, SECOND SPACER, THIRD SPACER AND FOURTH SPACER ATOP A TOP SURFACE OF A LOW-K DIELECTRIC LAYER COMPRISING A FIRST RECESSED VIA AND A SECOND RECESSED VIA, WHEREIN THE SECOND SPACER IS DEPOSITED ATOP THE TOP SURFACE OF THE LOW-K DIELECTRIC LAYER AND WITHIN THE FIRST RECESSED VIA — 110

↓

CONFORMALLY DEPOSITING A METAL LAYER ATOP THE TOP SURFACE OF THE LOW-K DIELECTRIC LAYER, THE FIRST SPACER, THE SECOND SPACER, THE THIRD SPACER, THE FOURTH SPACER, AND WITHIN FIRST RECESSED VIA AND THE SECOND RECESSED VIA TO FORM A FIRST COVERED SPACER, A SECOND COVERED SPACER, A THIRD COVERED SPACER, AND A FOURTH COVERED SPACER, WHEREIN THE FIRST RECESSED VIA IS FILLED WITH THE METAL LAYER AND THE SECOND SPACER — 120

↓

ETCHING, THE METAL LAYER TO EXPOSE THE TOP SURFACE OF THE FIRST SPACER, THE TOP SURFACE OF THE SECOND SPACER, THE TOP SURFACE OF THE THIRD SPACER, THE TOP SURFACE OF THE FOURTH SPACER, A TOP SURFACE OF THE LOW-K DIELECTRIC LAYER BETWEEN THE FIRST COVERED SPACER AND THE SECOND COVERED SPACER, A TOP SURFACE OF THE DIELECTRIC LAYER BETWEEN THE SECOND COVERED SPACER AND THE THIRD COVERED SPACER, A TOP SURFACE OF THE DIELECTRIC LAYER BETWEEN THE THIRD COVERED SPACER AND THE FOURTH COVERED SPACER, WHEREIN THE ETCHING FORMS A FIRST GAP BETWEEN THE BETWEEN THE FIRST COVERED SPACER AND THE SECOND COVERED SPACER, A SECOND GAP BETWEEN THE SECOND COVERED SPACER AND THE THIRD COVERED SPACER, A THIRD GAP BETWEEN THE THIRD COVERED SPACER AND THE FOURTH COVERED SPACER, WHEREIN THE THIRD GAP EXTENDS INTO THE SECOND RECESSED VIA EXPOSING THE TOP SURFACE OF A METAL LAYER THEREIN — 130

↓

FILLING THE FIRST GAP, SECOND GAP, AND THIRD GAP WITH A DIELECTRIC MATERIAL TO FORM A PATTERN WHEREIN A METAL LINE EXTENDS FROM THE FIRST RECESSED VIA, AND WHEREIN THE METAL LINE CONTACTS THE TOP SURFACE OF A METAL FILL WITHIN THE FIRST RECESSED VIA — 140

FIG. 1

METHODS AND APPARATUS FOR FABRICATION OF SELF ALIGNING INTERCONNECT STRUCTURE

CROSS-REFERENCE TO RELATED APPLICATIONS

This application claims benefit of U.S. provisional patent application Ser. No. 62/822,923, filed Mar. 24, 2019 which is herein incorporated by reference in its entirety.

FIELD

Embodiments of the present disclosure generally relate to semiconductor device interconnect lines and via plugs fabricated using multi-patterning processes.

BACKGROUND

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Interconnects provide the electrical connections between the various electronic elements of an integrated circuit and form the connections between the circuit elements and the device's external contact elements, such as pins, for connecting the integrated circuit to other circuits. Typically, interconnect lines form horizontal connections between electronic circuit elements while conductive via plugs form vertical connections between the electronic circuit elements, resulting in layered connections.

Advances in semiconductor materials and processing techniques have resulted in reducing the overall size of the integrated circuit elements while increasing their number or density on a single body. Additional miniaturization is highly desirable for improved integrated circuit performance and cost reduction. However, the inventors have observed limits in miniaturization techniques. For example, photolithography techniques have a minimum distance between the same points on adjacent spaced lines, or pitch, below which a particular photolithographic technique may not reliably form features such as vias. The minimum pitch of a photolithographic technique can limit feature size reduction. Thus, conventional lithographic techniques fall short in accurately producing vias with an extremely small pitch and small opening size and have resolution capabilities that problematically lead to high cost techniques outside of conventional lithographic techniques.

More specifically, vias may generally be formed by a lithographic process, where a photoresist layer is coated over a dielectric layer. A patterned mask may be disposed atop the photoresist and configured to expose the photoresist to radiation to form a hole in the photoresist upon development thereof. The opening for a via may be etched in the dielectric layer using the opening in the photoresist layer as an etch mask. The opening is a via opening, which may be filled with one or more metals or other conductive materials to form the via. As miniaturization continues, the size and the spacing of vias on a semiconductor chip continue to decrease. For example, the via opening in the top surface of a dielectric may be lower than 20 nanometers, and the pitch, or center-to-center distance between the closest adjacent via may be between 20 to 30 nanometers. The inventors have observed that pattering extremely small vias with extremely small pitches by lithographic process problematically results in, especially where the pitches are around 20 to 30 nanometers (nm) or less and/or where the dimensions of the via openings are around 20 nanometers or less, mismatched alignments with corresponding vias in additional or adjacent interconnect layers. Further, the inventors have observed that the small size and pitch of vias may result in shorts where vias are poorly configured or positioned in a substrate during a multi-patterning process. Moreover, the inventors have observed that the overlay between vias in adjacent interconnect layers are easily misaligned resulting in shorts and defects such as voids within a metal filled via.

Accordingly, a need exists for cost effective, improved techniques for self-aligned interconnect fabrication, where vias with extremely small openings are configured with an extremely small pitch on a semiconductor device.

SUMMARY

Methods and apparatus for forming interconnect structures are provided herein.

In some embodiments, a method of forming an interconnect structure, includes: depositing a plurality of spacers atop a top surface of a low-k dielectric layer including a plurality of recessed vias, wherein one or more of the plurality of spacers is deposited atop the top surface of the low-k dielectric layer and within one or more of the plurality of recessed vias to form a one or more partially filled recessed vias; depositing a conformal metal layer atop the top surface of the low-k dielectric layer, the plurality of spacers, and within the one or more partially filled recessed vias to form a plurality of filled vias; etching the conformal metal layer to remove portions thereof to expose a top surface of the plurality of spacers, the top surface of the low-k dielectric layer between the plurality of spacers, and within the plurality of filled vias to form a second plurality of partially filled recessed vias; and filling between the plurality spacers and within the second plurality of partially filled recessed vias with a dielectric material to form a second plurality of filled vias.

In some embodiments, a method of forming an interconnect structure includes depositing a first spacer, second spacer, third spacer and fourth spacer atop a top surface of a low-k dielectric layer including a first recessed via and a second recessed via, wherein the second spacer is deposited atop the top surface of the low-k dielectric layer and within the first recessed via; conformally depositing a metal layer atop the top surface of the low-k dielectric layer, the first spacer, the second spacer, the third spacer, the fourth spacer, and within first recessed via and the second recessed via to form a first covered spacer, a second covered spacer, a third covered spacer, and a fourth covered spacer, wherein the first recessed via is filled with the metal layer and the second spacer; etching the metal layer to expose the top surface of the first spacer, the top surface of the second spacer, the top surface of the third spacer, the top surface of the fourth spacer, a top surface of the low-k dielectric layer between the first covered spacer and the second covered spacer, a top surface of the dielectric layer between the second covered spacer and the third covered spacer, a top surface of the dielectric layer between the third covered spacer and the fourth covered spacer, wherein the etching forms a first gap between the between the first covered spacer and the second covered spacer, a second gap between the second covered spacer and the third covered spacer, a third gap between the third covered spacer and the fourth covered spacer, wherein the third gap extends into the second recessed via exposing the top surface of a metal layer therein; and filling the first gap, second gap, and third gap with a dielectric material to form a pattern wherein a metal line extends from the first recessed via, and wherein the metal line contacts the top surface of a metal fill within the first recessed via.

In some embodiments, a non-transitory computer readable medium having instructions stored thereon that, when executed, cause a method of forming an interconnect structure in an integrated tool, includes: depositing a plurality of spacers atop a top surface of a low-k dielectric layer including a plurality of recessed vias, wherein one or more of the plurality of spacers is deposited atop the top surface of the low-k dielectric layer and within one or more of the plurality of recessed vias to form a one or more partially filled recessed vias; depositing a conformal metal layer atop the top surface of the low-k dielectric layer, the plurality of spacers, and within the one or more partially filled recessed vias to form a plurality of filled vias; etching the conformal metal layer to remove portions thereof to expose a top surface of the plurality of spacers, the top surface of the dielectric layer between the plurality of spacers, and within the plurality of filled vias to form a second plurality of partially filled recessed vias; and filling between the plurality spacers and within the second plurality of partially filled recessed vias with a dielectric material to form a second plurality of filled vias.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 1 is a flow diagram of a method of making interconnect structures in accordance with one embodiment of the present disclosure;

Figure 2A:
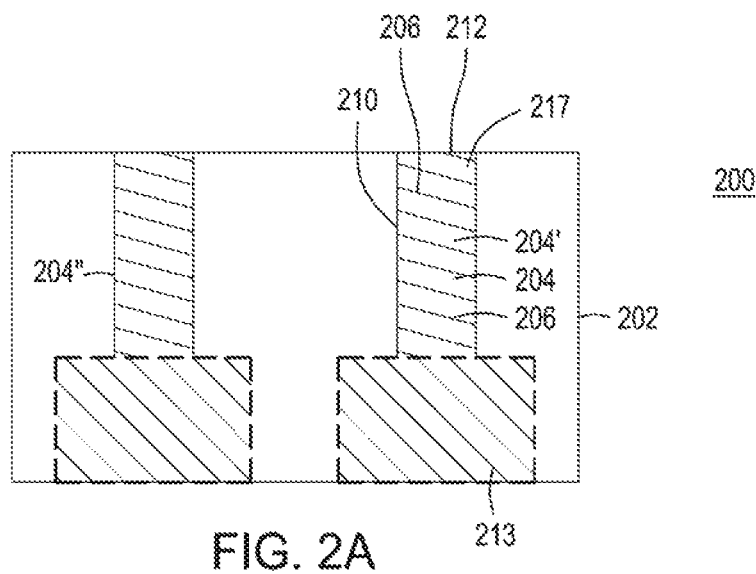
FIGS. 2A-2E depict a series of schematic, cross-sectional views of interconnect structures of the present disclosure at sequential stages of forming a structure suitable for use in accordance with the method of FIG. 1.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to methods of forming interconnect structures. In at least some embodiments, the methods described herein may advantageously use low cost lithographic methods with multi-patterning processes to fabricate interconnect structures, for example, by extending conventional lithography (e.g., 120 pitch) L/Sp beyond its supposed minimum pitch. This advantage, in combination with spacer placement, may be used for self-aligned multi-patterning processes to form advanced interconnects including vias with an average pitch of about 20-30 nanometer using low-k dielectric and recessed vias including metals such as ruthenium, molybdenum, tungsten, cobalt, nickel, iridium, rhodium, or aluminum. Interconnects formed in accordance with the present disclosure advantageously demonstrate excellent gap fill and interface characteristics and demonstrate low resistivity with fully landed interconnect. In embodiments, the multi-patterning processes provides a metal line extending from a recessed via, to advantageously configure the structure to reduce or eliminate shorts between adjacent metal lines when electric current is passed through the interconnect structure.

In embodiments, the methods of forming interconnect structures include process flows for fabricating structures such as self-aligned interconnects. In embodiments, the process flows are suitable for self-aligned quadruple patterning (SAQP) including a very high density of vias on a dielectric layer, and extremely small via openings, such as lower than 20 nanometers. Further the process flows are suitable for forming vias with a very small pitch, or center-to-center distance between the closest adjacent via in an amount of 20 to 30 nanometers. The process flow of the present disclosure is shown in fabrication structures such as interconnect structures as shown in FIGS. 3A-3F. These interconnect structures include fully formed interconnect structures and partially formed interconnect structures as shown herein.

FIG. 1 is a flow diagram of one embodiment of a method for forming an interconnect structure in accordance with one embodiment of the present disclosure as sequence 100. FIGS. 2A-2E depict a series of schematic, cross-sectional views of a substrate including a semiconductor device being pre-formed to be suitable for use in a process flow of the present disclosure, such as sequence 100. FIGS. 3A-3F depict a series of schematic, cross-sectional views of a substrate including a semiconductor device being fabricated as shown in sequence 100. The images in FIGS. 2A-2E, FIGS. 3A-3F, and FIG. 8 are not depicted to scale and are simplified for illustrative purposes. The methods of the present disclosure may be performed in process tool such as a multi-chamber tool shown in FIG. 6 including a number of process chambers, such as the process chamber discussed below with respect to FIG. 4, configured for forming structures of the present disclosure.

In some embodiments, prior to performing the sequence 100, a film stack 200 is formed or pre-formed including a low-k dielectric layer 202, one or more vias such as via 204 disposed within the low-k dielectric layer 202. Via 204 may be filled with metal 206 such as ruthenium, molybdenum, tungsten, cobalt, nickel, iridium, rhodium, aluminum, or combinations thereof. In some embodiments, the low-k dielectric layer 202 is disposed atop a substrate (not shown in FIG. 2A-2E). In embodiments, the substrate may comprise a material such as crystalline silicon (e.g., Si<100> or Si<111>), silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, and combinations thereof. In embodiments, the substrate may have various dimensions, such as 200 mm, 300 mm, 450 mm or other diameters for round substrates. The substrate may also be any polygonal, square, rectangular, curved or otherwise non-circular workpiece, such as a polygonal glass substrate used in the fabrication of flat panel displays. Unless otherwise noted, implementations and examples described herein are conducted on substrates such as a substrate with a 200 mm diameter, a 300 mm diameter, or a 450 mm diameter substrate.

In embodiments, low-k dielectric layer 202 is deposited atop a substrate by any suitable atomic layer deposition process or a chemical layer deposition process to a thickness sufficient to insulate film stack 200. In embodiments, the low-k dielectric layer 202 is generally formed from a material having a low-k value suitable for insulating material and sufficient to separate interconnects. In embodiments, low-k dielectric layer 202 is made of a material and provided at a thickness sufficient to reduce charge build-up in film stack 200. In embodiments, low-k dielectric layer 202 may be deposited on a substrate by reacting a processing gas in a plasma to form a dielectric layer having a dielectric constant less than about 4. Non-limiting materials suitable as low-k dielectric material may comprise a silicon containing material, for example, such as silicon oxide (SiO2), silicon nitride, or silicon oxynitride (SiON), or combinations thereof, or combinations of layers thereof. In embodiments, the low-k dielectric material may have a low-k value of less than about 3.9 (for example, about 2.5 to about 3.5). In embodiments, the low-k dielectric layer 202 comprises material including one or more of polyimides, polytetrafluoroethylenes, parylenes, polysilsesquioxanes, fluorinated poly(aryl ethers), fluorinated amorphous carbon, silicon oxycarbides, and silicon carbides. In some embodiments, the low-k dielectric layer 202 comprises silicon oxycarbides, including, for example, silicon oxycarbides including various silicon, carbon, oxygen, and hydrogen containing materials. For example, the silicon oxycarbides may comprise silicon oxycarbides, such as BLACK DIAMOND™ brand film, available from Applied Materials, Inc., Santa Clara, Calif. A method for depositing silicon oxycarbides is described in U.S. Pat. No. 6,287,990, entitled, "CVD Plasma Assisted Low Dielectric Constant Films," assigned to Applied Materials, Inc.

In embodiments, the low-k dielectric layer 202 may include one or more features such as via 204 or trench formed in the low-k dielectric layer 202. In embodiments, the low-k dielectric layer 202 may include a first via 204' and a second via 204", as used herein to discuss the methods of the present disclosure. The one or more vias such as via 204 may be formed by etching the low-k dielectric layer 202 using any suitable etch process. In some embodiments, the one or more vias such as via 204 is defined by one or more sidewalls 210, an opening 212 and upper corners 217. In some embodiments, the one or more vias such as via 204 may have a high aspect ratio, e.g., an aspect ratio between about of about 5:1 and about 20:1. As used herein, the aspect ratio is the ratio of a depth of the feature to a width of the feature. In embodiments, the one or more vias such as via 204 has a width less than or equal to 20 nanometers, less than or equal to 10 nanometers, or a width between 5 to 10 nanometers. In embodiments, the one or more vias such as via 204 has a pitch, or center to center distance from the closest adjacent via of less than or equal to 30 nanometers, less than or equal to 25 nanometers, or a pitch between 20 to 30 nanometers. In embodiments, via 204 is filled with a metal such as tungsten, titanium nitrate, ruthenium, molybdenum, cobalt, nickel, iridium, rhodium, aluminum, or combinations thereof.

In embodiments, the low-k dielectric layer 202 may optionally include one or more devices such as device 213 within the low-k dielectric layer 202 and in communication with one or more vias such as via 204, wherein via 204 is filled or partially filled with metal as described herein. In embodiments, non-limiting examples of device 213 may include Logic, DRAM, or a Flash memory devices.

Figure 2B:
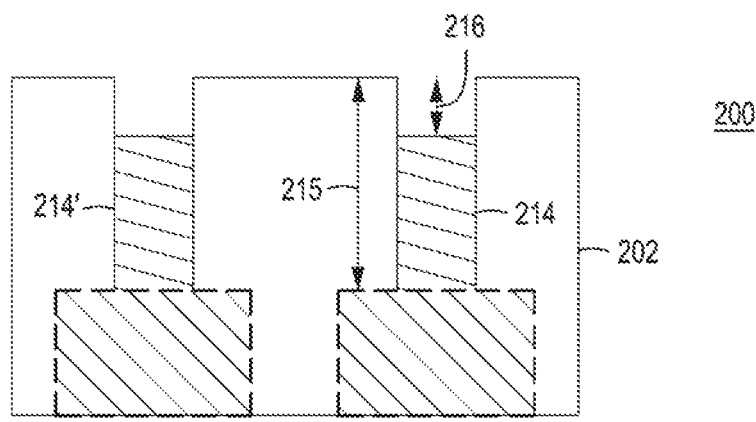

Referring now to FIG. 2B, in embodiments, the structure such as film stack 200 is shown with a recessed via 214. In embodiments, recessed via 214 has a depth shown as arrow 215 of between 15 and 30 nanometers, and the recess, or removed portion shown as arrow 216 of metal fill in an amount of about 5 to 10 nanometers. One or more recessed vias such as recessed via 214 may be formed by any suitable etch process known in the art such as where the metal within via 204 will etch selectively over the low-k dielectric layer 202 to form recessed via 214 as shown in FIG. 2B. In embodiments, the removed portion is about 5%, 10%, 15%, 20%, 25%, or 30%, or about 5-30 percent of the depth of the via or recessed via, measured from the top surface of the low-k dielectric layer.

Figure 2C:
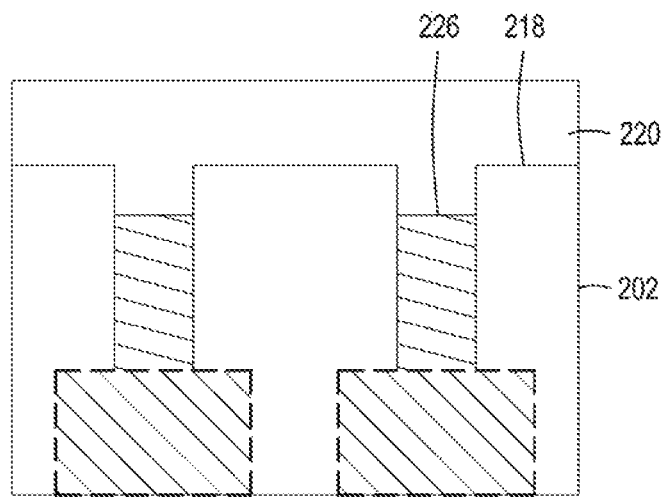

Referring now to FIG. 2C, a hardmask layer 220 is shown deposited atop the top surface 218 of the low-k dielectric layer 202. In embodiments, hardmask layer 220 is deposited to a thickness suitable for a photolithographic technique. In embodiments, hardmask layer 220, comprises carbon, amorphous silicon, silicon oxynitride, silicon nitride, or combinations thereof. In embodiments, the hardmask layer 220 extends into the recessed via 214 and contacts the top surface 226 of the recessed metal therein. In embodiments, hardmask layer 220 includes amorphous silicon films suitable or use in a self-aligned quadruple patterning process (SAQP) of the present disclosure. Typically, such amorphous silicon films may be formed via a chemical vapor deposition (CVD) process.

Figure 2D:
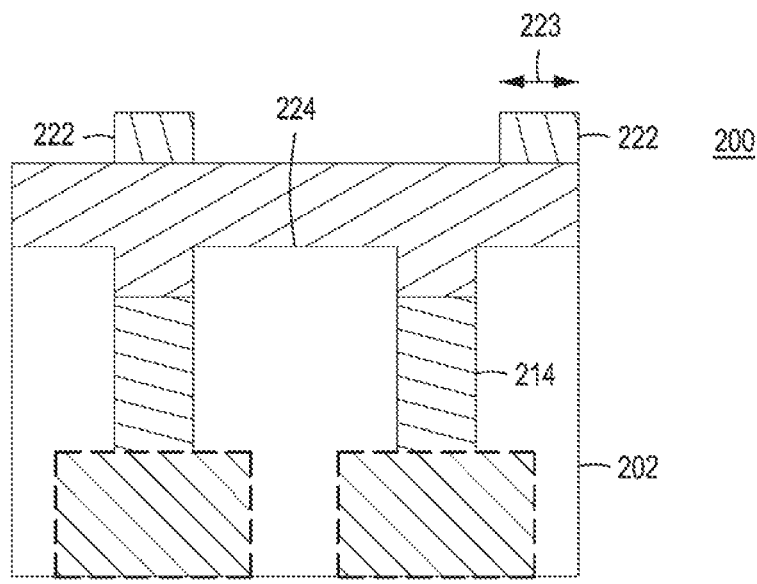
Figure 2E:
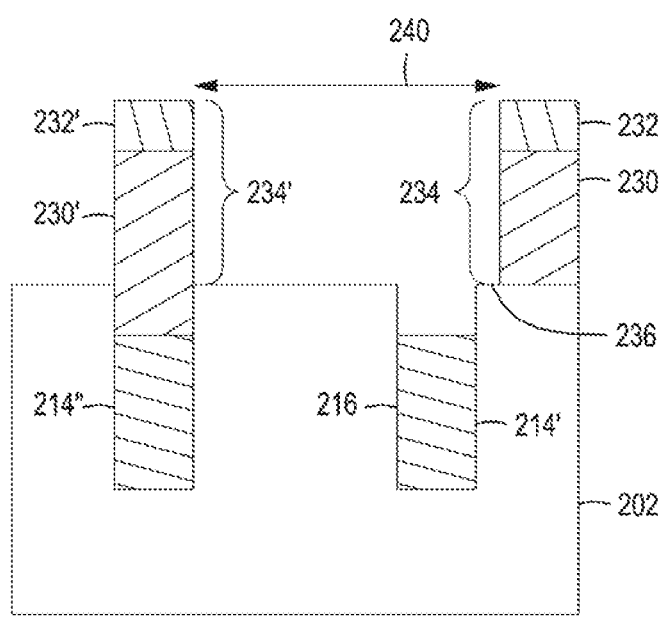

Referring now to FIG. 2D, one or more patterned resists are shown as layer 222 deposited upon hardmask layer 220. In embodiments, the resist has a width of about 50 to 60 nanometers, such as 45 nanometers as shown by arrow 223. In embodiments, the structure may be subjected to a hardmask etch to selectively remove the hardmask from the top surface 224 of the low-k dielectric layer 202. The hardmask etch may be any suitable etch known in the art such as etch selective towards the hardmask materials over the low-k dielectric layer 202 or metal within recessed via 214. In embodiments, methods of the present disclosure form a structure such as a structure shown in FIG. 2E, including a low-k dielectric layer 202 including a first recessed via 214', a first hardmask 230 and first resist 232 forming a first patterning portion or first mandrel 234, a second hardmask 230' and a second resist 232' forming a second patterning portion or second mandrel 234', wherein the first patterning portion or first mandrel 234 is atop the low-k dielectric layer 202 and adjacent the first recessed via 214' with a portion of the top surface 236 of the low-k dielectric layer there between. In embodiments, the second mandrel 234' is positioned above the second recessed via 214" In embodiments, the interstices having a width of about 75 nanometers may be between the first mandrel 234 and second mandrel 234' as shown by arrow 240. In some embodiments, the first recessed via and second recessed via are partially filled with tungsten.

Figure 7A:
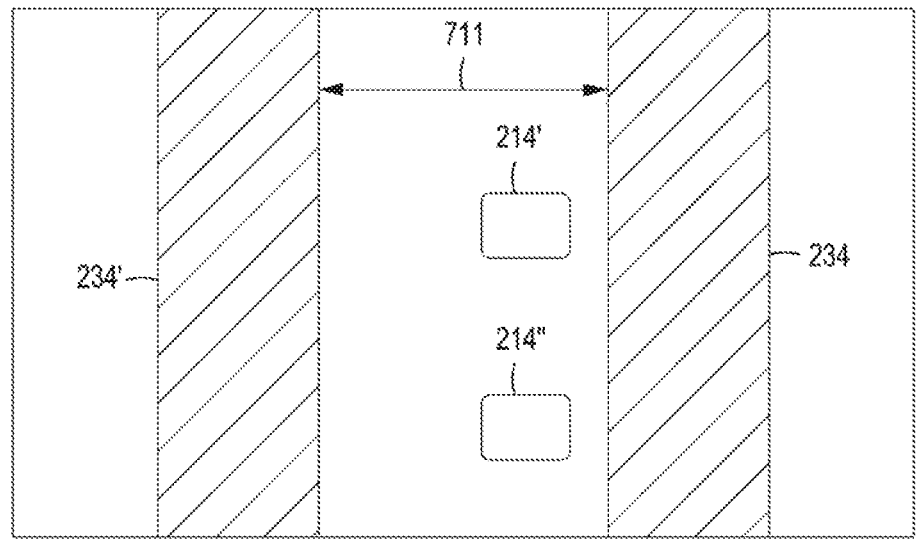
FIGS. 7A-7D show a series of top-down overlay views for forming interconnect structures in accordance with the present disclosure.

Referring now to FIG. 7A, a top down view is shown of first mandrel 234 and second mandrel 234' atop a low-k dielectric layer in accordance with the present disclosure. Arrow 711 shows the distance between the first mandrel 234 and second mandrel 234'. A first recessed via 214' and second recessed via 214'' are also shown in a position suitable for methods of the present disclosure. In some embodiments, the first recessed via and second recessed via are partially filled with tungsten.

Figure 3A:
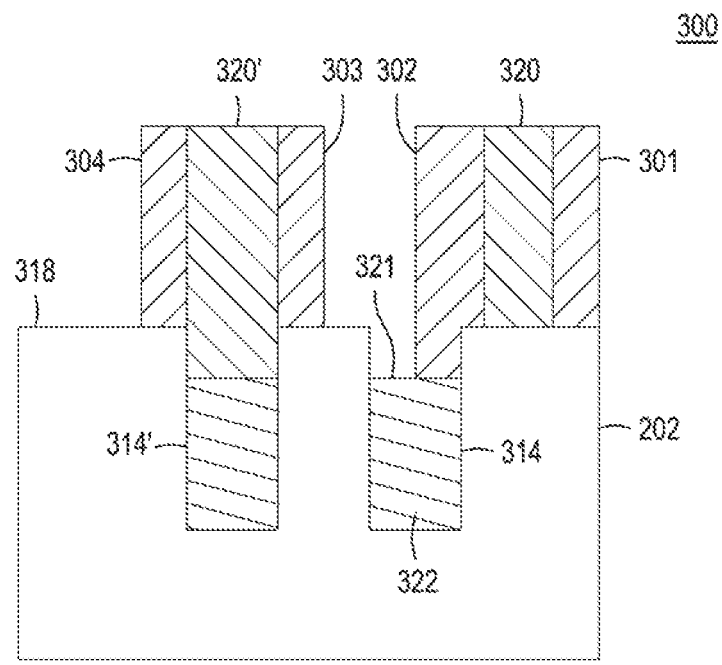
FIGS. 3A-3F depict a series of schematic, cross-sectional side view embodiments of interconnect structures of the present disclosure at sequential stages in accordance with the method of FIG. 1.

Referring now to FIG. 1, at 110, and FIG. 3A, the methods of the present disclosure include depositing a first spacer 301, second spacer 302, third spacer 303 and fourth spacer 304 atop a top surface 318 of a low-k dielectric layer 202 including a first recessed via 314 and a second recessed via 314', wherein the second spacer 302 is deposited atop the top surface 318 of the low-k dielectric layer 202 and within the first recessed via 314. In some embodiments, one or more spacers may be defined by one or more sidewalls, a top surface, and upper corners. FIG. 3A shows structure 300 including a low-k dielectric layer 202 including a first recessed via 314, a first hardmask forming a first mandrel 320, a second hardmask forming a second mandrel 320', wherein the first mandrel 320 is atop the low-k dielectric layer 202 and adjacent the first recessed via 314 with a spacer, such as second spacer 302, formed on the edge of first mandrel 320 atop the top surface 318 of the low-k dielectric layer 202 and within the first recessed via 314. In embodiments the second spacer 302 does not completely fill the via opening of first recessed via 314. In embodiments, the first mandrel 320 and second mandrel 320' are patterned near the optical resolution of a photolithography system using a high-resolution photomask.

In some embodiments, the first spacer 301, second spacer 302, third spacer 303 and fourth spacer 304 may be formed by depositing a spacer material conformally atop the top surface of the low-k dielectric layer 202. For example, in embodiments, a spacer layer (not shown) is conformally deposited atop the low-k dielectric layer 202, first mandrel 320 and second mandrel 320'. The conformal spacer layer is etched to remove portions that are not positioned on the sidewall of the first mandrel 320 and second mandrel 320'. In some embodiments, a carbon-containing layer may be formed over the conformal spacer layer. The carbon-containing layer is anisotropically etched to expose the high points of the conformal spacer layer while retaining carbon side panels. The conformal spacer layer may then be etched to form spacers adjacent to the first mandrel 320 and second mandrel 320'. In embodiments, spacers and etching conditions are performed to form the spacers as described in U.S. Pat. No. 9,269,590 entitled Spacer Formation to Luere et al. and assigned to Applied Materials, Inc. In embodiments, the etch extends into first recessed via 314 to ensure the exposure of the top surface 321 of a metal therein. For example, referring to FIG. 3A, the top surface 321 of metal portion 322 in first recessed via 314 is exposed.

Figure 3B:
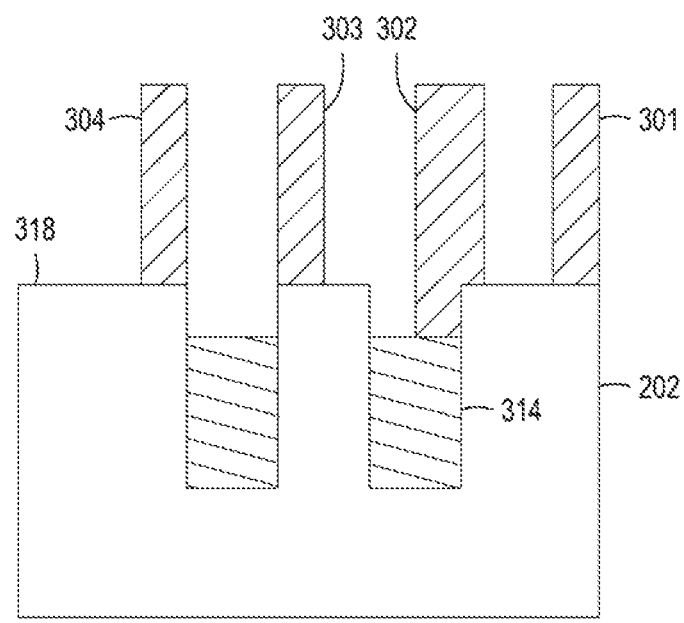

Referring to FIG. 3B, in embodiments, after forming the at least four spacers such as the first spacer 301, second spacer 302, third spacer 303 and fourth spacer 304 atop the top surface 318 of a low-k dielectric layer 202 including at least two recessed vias, wherein one of the four spacers, such as second spacer 302, is deposited atop the top surface 118 of the low-k dielectric layer 202 and within a recessed via such as first recessed via 314 the hardmask material is removed. In embodiments, an etch step of the hardmask material between the spacers may be performed to remove the mandrels such as first mandrel 320 and second mandrel 320', leaving only the spacers atop the low-k dielectric layer 202. For example, an oxide spacer etch may be performed to form a structure as shown in FIG. 3B, where a first spacer 301, second spacer 302, third spacer 303, and fourth spacer 304 are separated by interstices and positioned atop the top surface of the low-k dielectric layer 202. In embodiments, second spacer 302 is also positioned within the first recessed via 314 contacting the metal or conductive material therein while have a bottom portion thereof also atop the low-k dielectric layer.

Figure 7B:
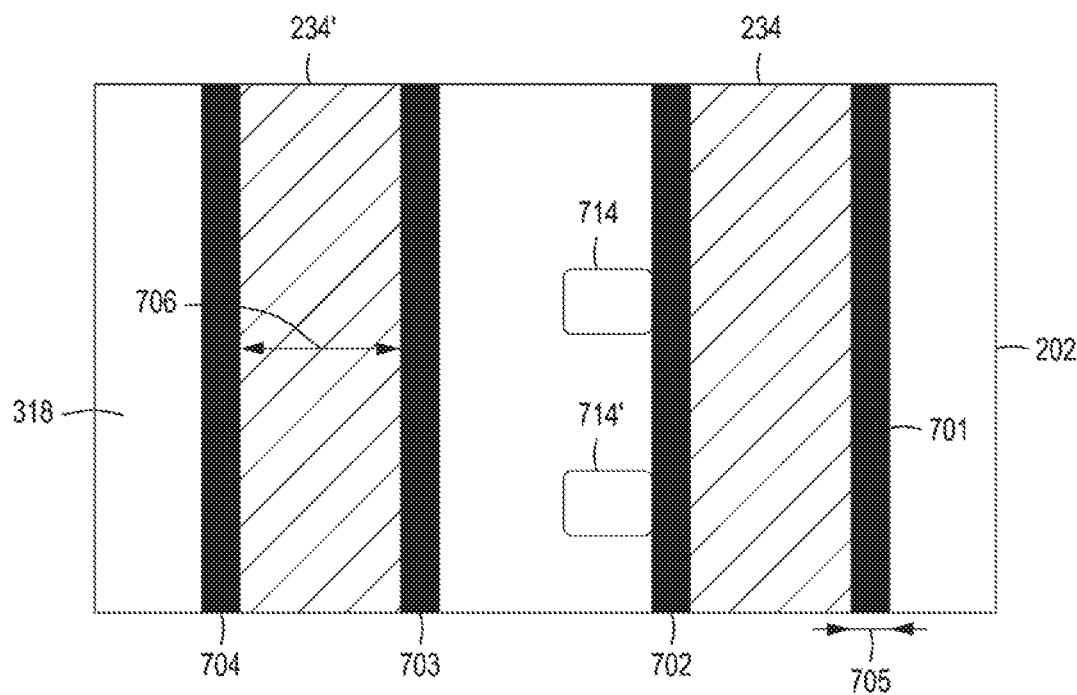

FIG. 7B shows a top down view of first mandrel 234 and second mandrel 234' atop a low-k dielectric layer 202 in accordance with the present disclosure. Arrow 705 shows the thickness of the first spacer 701, which may be the same for second spacer 702, third spacer 703 and fourth spacer 704 atop the top surface 318 of a low-k dielectric layer 202, which is approximately 15 nanometers, or 15 nanometers. A first recessed via 714 and second recessed via 714' are also shown in a position suitable for methods of the present disclosure. Arrow 706 shows the thickness of second mandrel 234' which is approximately 45 nanometers, or 45 nanometers, and in some embodiments is the same thickness of first mandrel 234.

In some embodiments, spacers may be formed by extreme ultraviolet (EUV) patterning with a hardmask to form spacers atop the low-k dielectric layer. For example, self-aligned double pattering of metal spacer interconnect may be suitable for use herein. In embodiments, a hardmask, such as low-k or oxide hardmask is deposited atop a low-k dielectric layer including a plurality of recessed vias, such as a first recessed via and a second recessed via. A resist suitable for EUV patterning is deposited atop the hardmask. The resist may be patterned including a 40-60 nanometer pitch. In embodiments, the resist is patterned and placed atop the hardmask such that it will form the spacers as substantially shown and described in FIG. 3B. Upon activation, the exposed hardmask areas will be removed leaving spacers atop the low-k dielectric layer as shown in FIG. 3B.

Figure 3C:
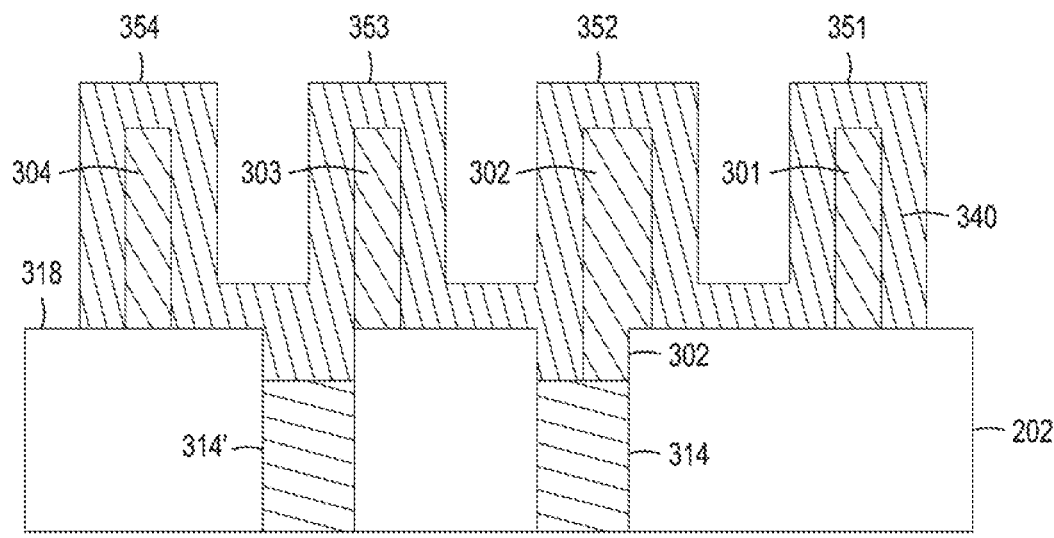

Referring back to FIG. 1, at process sequence 120, and FIG. 3C, after depositing the spacers, such as the first spacer 301, second spacer 302, third spacer 303 and fourth spacer 304, a metal layer 340 is conformally deposited atop the top surface 318 of the low-k dielectric layer 202, the first spacer 301, the second spacer 302, the third spacer 303, the fourth spacer 304, and within first recessed via 314 and the second recessed via 314' to form a first covered spacer 351, a second covered spacer 352, a third covered spacer 353, and a fourth covered spacer 354, wherein the first recessed via 314 is filled with the metal layer 340 and the second spacer 302. In embodiments, the metal layer 340 is conformally deposited, which refers to providing a generally uniform layer of metal material such as metal layer 340 on a surface such as top surface 318 in the same shape as the surface, for example, the surface of the layer and the surface being covered are generally parallel within acceptable tolerances. In embodiments, the metal layer 340 may have sidewall thickness between about 90% and about 110% or between about 95% and about 105% of the width of the first spacer 301, second spacer 302, third spacer 303 or fourth spacer 304. In embodiments, the metal layer 340 is deposited to a thickness of about equal to the thickness of a spacer. In embodiments, metal layer 340 is deposited to a thickness of about 4 to 15 nanometers, about 5, about 10, or about 15 nanometers. In embodiments, the metal layer 340 comprises copper, tungsten, or other suitable interconnect metal line metal material such as copper, ruthenium, molybdenum, tungsten, cobalt, nickel, iridium, rhodium, aluminum, or combinations thereof.

In embodiments, as shown in FIG. 3C, a metal layer 340 is conformally deposited atop the top surface 318 of the low-k dielectric layer 202, the first spacer 301, the second spacer 302, the third spacer 303, the fourth spacer 304, and within first recessed via 314 and the second recessed via 314' to form a first covered spacer 351, a second covered spacer 352, a third covered spacer 353, and a fourth covered spacer 354, wherein the first recessed via 314 is filled with the metal layer 340 and the second spacer 302. In embodiments, a second recessed via 314' is also filled with the metal layer 340. In embodiments, the metal is deposited by ALD or CVD methods known in the art to deposit ruthenium, molybdenum, tungsten, cobalt, nickel, iridium, rhodium, aluminum, or combinations thereof. In embodiments, the metal layer 340 is deposited into the first recessed via 314.

Figure 3D:
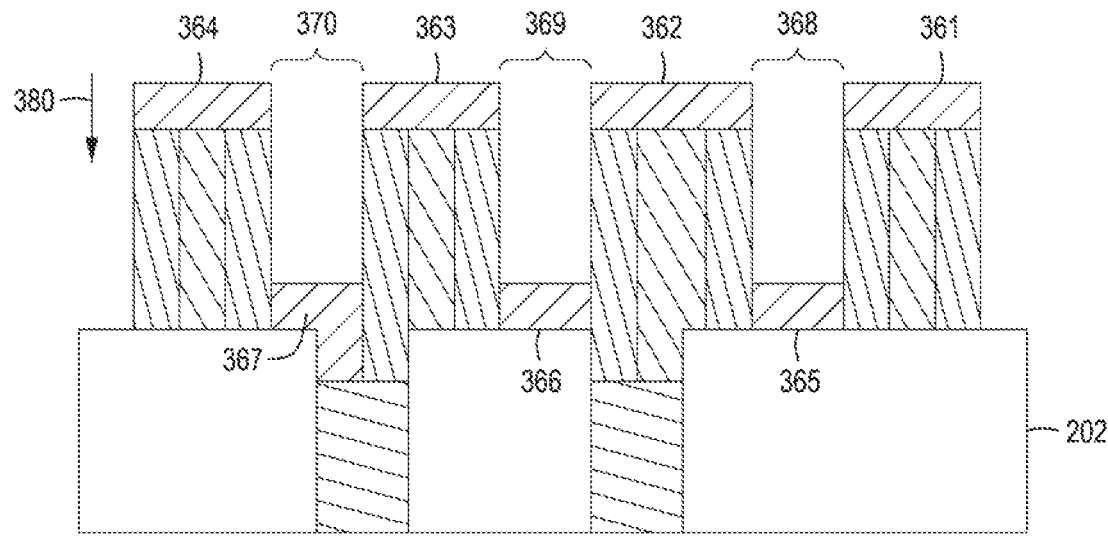
Figure 3E:
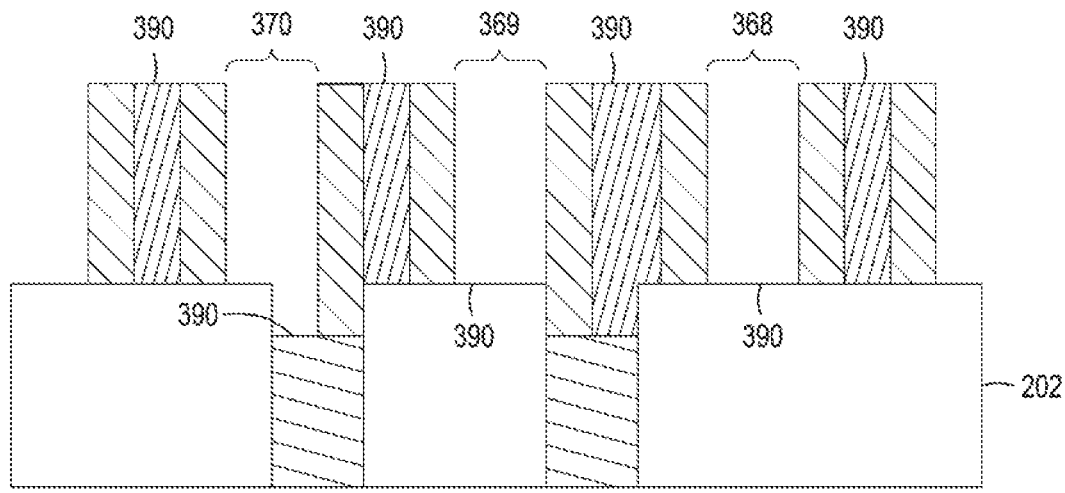

In embodiments, referring to FIG. 1 at 130, and FIG. 3D, the metal layer 340 is etched to remove portions thereof. For example, the metal layer 340 is etched to expose the top surface 361 of the first spacer, the top surface 362 of the second spacer, the top surface 363 of the third spacer, the top surface 364 of the fourth spacer, a top surface 365 of the dielectric layer between the first covered spacer and the second covered spacer, a top surface 366 of the dielectric layer between the second covered spacer and the third covered spacer, a top surface 367 of the dielectric layer between the third covered spacer and the fourth covered spacer, wherein the etching forms a first gap 368 between the between the first covered spacer and the second covered spacer, a second gap 369 between the second covered spacer and the third covered spacer, a third gap 370 between the third covered spacer and the fourth covered spacer, wherein the third gap 370 extends into the second recessed via 314' exposing the top surface of a metal layer therein. FIG. 3E shows a structure of the present disclosure after removal of the portions of metal layer 340, as described herein.

In embodiments, portions of metal layer 340 may be removed by a cyclic atomic layer etching process in an atomic layer etch (ALE) chamber. In embodiments the etching is one directional such as in the direction of arrow 380' to focus removal of the portions of metal layer 340 described above. In embodiments, atomic layer etching may include a directional plasma application (oxygen, hydrogen) to modify metal in direct view or perpendicular to arrow 380'. The ALE process may include treating the surface, etching the surface, annealing the surface, and repeating this sequence until an amount of metal material is removed to expose the low-k dielectric layer and top surfaces of the spacers. In embodiments, the etch stop is on the via and metal therein and the top surface of the low-k dielectric layer.

In embodiments, the deposition at process sequence 120 and etch 130 may occur in a cyclic manner. For example, in some embodiments a predetermined amount of metal material may be deposited in a manner described above with respect to process sequence 120. After a predetermined amount of material is deposited, such as 3 to 10 angstroms by an ALD process, or about 5 angstroms of metal is deposited, the metal may be annealed, such as by flash anneal or laser anneal to grow the grain size of the metal material larger, subsequently treated with an oxygen plasma reaction, and etched to expose the top surface 361 of the first spacer, the top surface 362 of the second spacer, the top surface 363 of the third spacer, the top surface 364 of the fourth spacer, a top surface 365 of the dielectric layer between the first covered spacer and the second covered spacer, a top surface 366 of the dielectric layer between the second covered spacer and the third covered spacer, a top surface 367 of the dielectric layer between the third covered spacer and the fourth covered spacer, wherein the etching forms a first gap 368 between the between the first covered spacer and the second covered spacer, a second gap 369 between the second covered spacer and the third covered spacer, a third gap 370 between the third covered spacer and the fourth covered spacer, wherein the third gap 370 extends into the second recessed via 314' exposing the top surface of a metal layer therein. In embodiments, the etch does not remove the portions of metal material deposited upon the sidewalls of the spacers. Accordingly, another deposit of metal is made, such as 3 to 10 angstroms by an ALD process, or about 5 angstroms of metal is deposited, and the process repeats. In embodiments, depositing conformal metal, annealing, treating with oxygen plasma, and etching as described above may be repeated until the metal is deposited on the sidewalls of the spacers in an amount sufficient to coat the spacers, such as 5 to 20 nanometers. Accordingly, the cyclic deposition and annealing may cycle thousands of times to form a structure shown in FIG. 3E. In embodiments, an integrated tool may include a plurality of chambers, or a single chamber may be configured for, sufficient depositing of the metal material, anneal deposited metal material, plasma treat the annealed metal material, and etching the metal layer 340 to form a structure as shown in FIG. 3E. In some embodiments, the present disclosure includes a method of forming an interconnect structure, the method including: (a) depositing a plurality of spacers atop a top surface of a low-k dielectric layer including a plurality of recessed vias, wherein one or more of the plurality of spacers is deposited atop the top surface of the low-k dielectric layer and within one or more of the plurality of recessed vias to form a one or more partially filled recessed vias; (b) depositing a conformal metal layer atop the top surface of the low-k dielectric layer, plurality of spacers, and within the one or more partially filled recessed vias to form a plurality of filled vias; (c) etching the conformal metal layer to remove portions thereof to expose a top surface of the plurality of spacers, the top surface of the low-k dielectric layer between the plurality of spacers, and within the plurality of filled vias to form a second plurality of partially filled recessed vias; (d) repeating (b) and (c) a plurality of times until the plurality of spacer have a desired thickness of metal upon the sidewalls thereof; and (e) filling between the plurality spacers and within the second plurality of partially filled recessed vias with a dielectric material to form a second plurality of filled vias. In embodiments, process sequence (b) is performed until about 5 to 20, 5 to 10 angstroms of metal is conformally deposited atop the spacer and low-k dielectric layer. In embodiments, (c) is performed to remove portions of conformally deposited metals, but not metal deposited on the sidewalls of the plurality of spacers. In embodiments, (b) and (c) are cyclically repeated hundred, or thousands of times in an integrated tool in order to obtain a desired or predetermined thickness of metal atop the sidewalls of the spacers.

Figure 4:
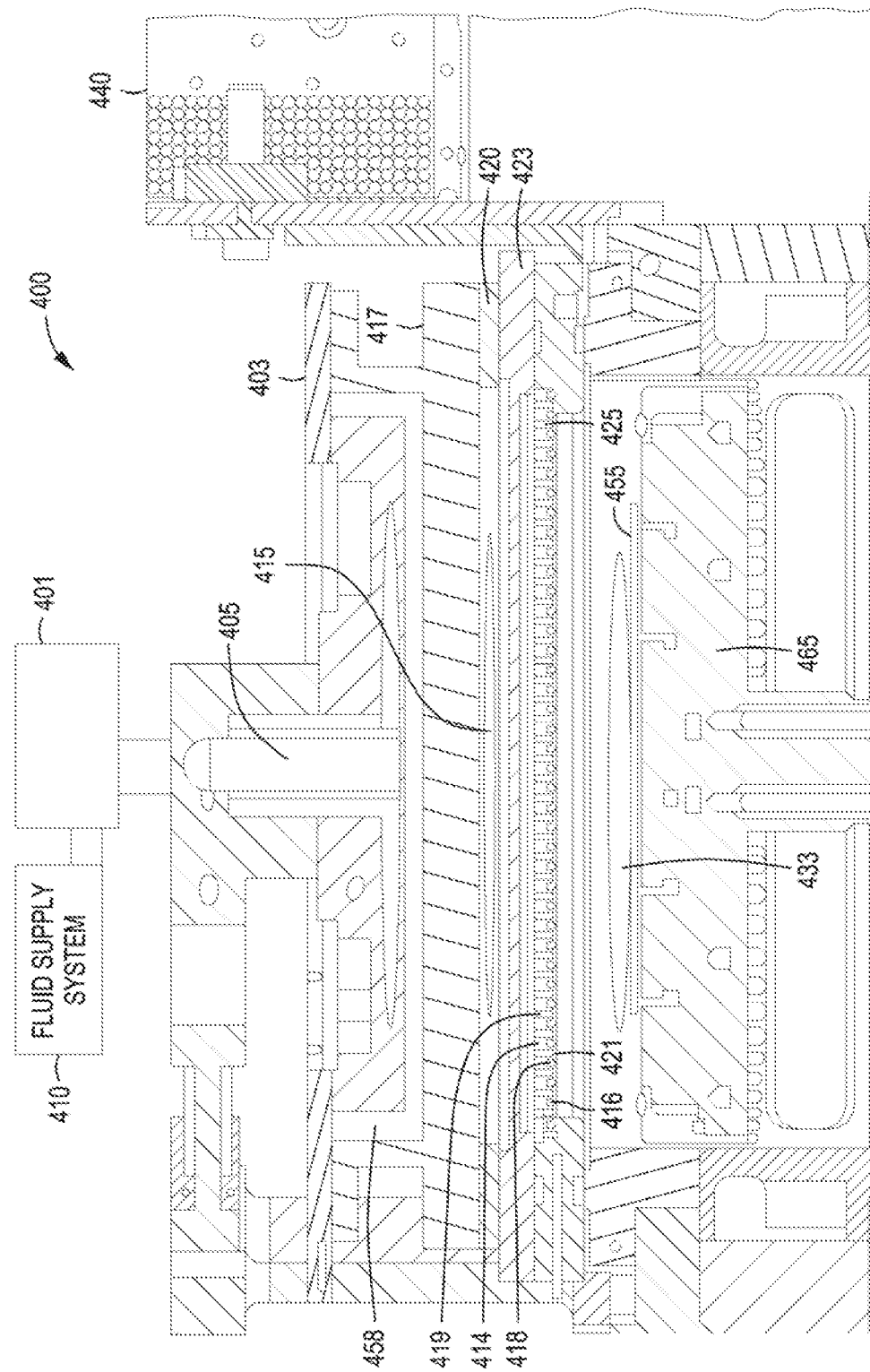
FIG. 4 depicts an etch chamber suitable for performing a method of filling a feature in a substrate in accordance with some embodiments of the present disclosure.

A non-limiting example an exemplary etching chamber system such as process chamber 400 is shown in FIG. 4. During metal layer 340 etching, a process gas may be flowed into the first plasma region 415 through a gas inlet assembly 405. A remote plasma system (RPS) 401 may optionally be included in the system and may process a first gas which then travels through gas inlet assembly 405. The gas inlet assembly 405 may include two or more distinct gas supply channels where the second channel (not shown) may bypass the RPS 401, if included.

A cooling plate 403, faceplate 417, ion suppressor 423, showerhead 425, and a pedestal 465, having a substrate 455 disposed thereon, are shown in FIG. 4 and may each be included according to embodiments. The pedestal 465 may have a heat exchange channel through which a heat exchange fluid flows to control the temperature of the substrate, which may be operated to heat and/or cool the substrate or wafer during processing operations. The wafer support platter of the pedestal 465, which may comprise aluminum, ceramic, or a combination thereof, may also be resistively heated in order to achieve relatively high temperatures, such as from up to or about 100 degrees Celsius to above or about 600 degrees Celsius, using an embedded resistive heater element.

The faceplate 417 may be pyramidal, conical, or of another similar structure with a narrow top portion expanding to a wide bottom portion. The faceplate 417 may additionally be flat as shown and include a plurality of through-channels used to distribute process gases. Plasma generating gases and/or plasma excited species, depending on use of the RPS 401, may pass through a plurality of holes (not shown).

Non-limiting exemplary configurations may include having the gas inlet assembly 405 open into a gas supply region 458 partitioned from the first plasma region 415 by faceplate 417 so that the gases/species flow through the holes in the faceplate 417 into the first plasma region 415. Structural and operational features may be selected to prevent significant backflow of plasma from the first plasma region 415 back into the gas supply region 458, gas inlet assembly 405, and fluid supply system 410. The faceplate 417, or a conductive top portion of the chamber, and showerhead 425 are shown with an insulating ring 420 located between the features, which allows an AC potential to be applied to the faceplate 417 relative to showerhead 425 and/or ion suppressor 423. The insulating ring 420 may be positioned between the faceplate 417 and the showerhead 425 and/or ion suppressor 423 enabling a capacitively coupled plasma (CCP) to be formed in the first plasma region. A baffle (not shown) may additionally be located in the first plasma region 415, or otherwise coupled with gas inlet assembly 405, to affect the flow of fluid into the region through gas inlet assembly 405.

The ion suppressor 423 may comprise a plate or other geometry that defines a plurality of apertures throughout the structure that are configured to suppress the migration of ionically-charged species out of the first plasma region 415 while allowing uncharged neutral or radical species to pass through the ion suppressor 423 into an activated gas delivery region between the suppressor and the showerhead. In embodiments, the ion suppressor 423 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 423 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter the etch selectivity of the gas mixture.

The plurality of apertures in the ion suppressor 423 may be configured to control the passage of the activated gas, i.e., the ionic, radical, and/or neutral species, through the ion suppressor 423. For example, the aspect ratio of the holes, or the hole diameter to length, and/or the geometry of the holes may be controlled so that the flow of ionically-charged species in the activated gas passing through the ion suppressor 423 is reduced. The holes in the ion suppressor 423 may include a tapered portion that faces the plasma excitation region such as the first plasma region 415, and a cylindrical portion that faces the showerhead 425. The cylindrical portion may be shaped and dimensioned to control the flow of ionic species passing to the showerhead 425. An adjustable electrical bias may also be applied to the ion suppressor 423 as an additional means to control the flow of ionic species through the suppressor.

The ion suppressor 423 may function to reduce or eliminate the amount of ionically charged species traveling from the plasma generation region to the substrate. Uncharged neutral and radical species may still pass through the openings in the ion suppressor to react with the substrate. The complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 425 in combination with ion suppressor 423 may allow a plasma present in first plasma region 415 to avoid directly exciting gases in substrate processing region 433, while still allowing excited species to travel from chamber plasma region such as the first plasma region 415 into substrate processing region 433. Thus, the chamber may be configured to prevent the plasma from contacting a substrate 455 being etched, which can advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, the oxide material may be further protected by maintaining the plasma remotely from the substrate.

The showerhead 425 may comprise an upper plate 414 and a lower plate 416. The plates may be coupled with one another to define a volume 418 between the plates. The coupling of the plates may be so as to provide first fluid channels 419 through the upper and lower plates, and second fluid channels 421 through the lower plate 416. The formed channels may be configured to provide fluid access from the volume 418 through the lower plate 416 via second fluid channels 421 alone, and the first fluid channels 419 may be fluidly isolated from the volume 418 between the plates and the second fluid channels 421. The volume 418 may be fluidly accessible through a side of the gas distribution assembly 425.

The processing system may further include a power supply 440 electrically coupled with the processing chamber to provide electric power to the faceplate 417, ion suppressor 423, showerhead 425, and/or pedestal 465 to generate a plasma in the first plasma region 415 or substrate processing region 433. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the first plasma region 415. Providing a tunable plasma, in turn, may advantageously allow development of particular plasma characteristics such that precursors may be dissociated in specific ways to enhance the etching profiles produced by these precursors.

A plasma may be ignited either in chamber plasma region such as the first plasma region 415 above showerhead 425 or substrate processing region 433 below showerhead 425. Plasma may be present in chamber plasma region such as the first plasma region 415 to produce the radical precursors from an inflow of, for example, a chlorine-containing precursor or other precursor. An AC voltage typically in the radio frequency (RF) range may be applied between the pedestal 465, and showerhead 425 and/or ion suppressor 423 to ignite a plasma in chamber plasma region such as the first plasma region 415 during deposition. An RF power supply may generate a high RF frequency of 13.56 MHz but may also generate other frequencies alone or in combination with the 13.56 MHz frequency. In embodiments, RF is applied to the pedestal 465.

In some embodiments, after the etching process at 130, the exposed surfaces 390 (FIG. 3E) may optionally be exposed to a hydrogen-containing plasma to remove etch residue left behind by removal of any oxidized layer. In embodiments, the exposed surfaces 390 after the etching process is exposed to the hydrogen-containing plasma for a period of between about 10 second and about 300 seconds and the flow rate of the hydrogen gas is between about 500 sccm/s and about 4,000 sccm/s. In embodiments, after the etching process at 130, the structure of FIG. 3E is formed including, a plurality of metal lines 391, and plurality of spacers 392 such as dielectric spacers, and a plurality of interstices such as a first gap 368, second gap 369, and third gap 370 now formed between the plurality of metal lines 391. In embodiments, the third gap 370 extends into the second recessed via to the exposed top surface of a metal material therein as shown in FIG. 3E.

Figure 3F:
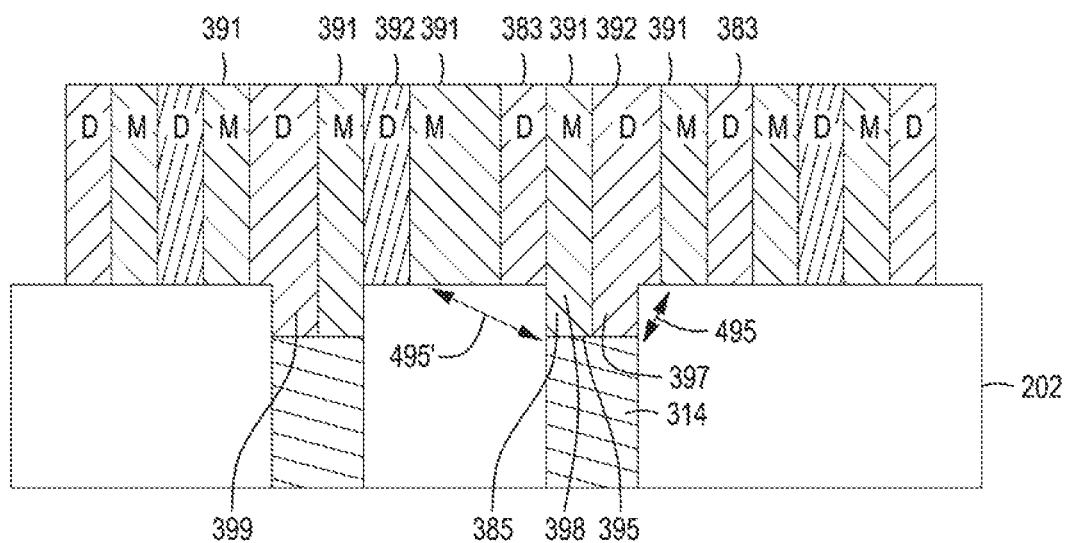

Referring back to FIG. 1 at 140, and FIG. 3F, the process sequence includes filling the first gap 368, second gap 369, and third gap 370 with a dielectric material to form a pattern wherein a metal line 385 extends from the first recessed via 314, and wherein the metal line contacts the top surface 395 of the metal fill within the first recessed via 314. In embodiments, the dielectric material may be deposited by ALD or flowable material, such as a flowable low-k dielectric material. In embodiments, the structure is polished off with CMP. Referring to FIG. 3F, a structure formed in accordance with the present disclosure incudes a plurality of metal lines 391, plurality of spacers 392, and plurality of dielectric lines 383 atop the top surface of the low-k dielectric layer 202. In embodiments, the first recess via 314 includes a portion of the second spacer 397 and metal line 398 extending from the top surface of the metal therein. In embodiments, the second recessed via includes a portion of a dielectric material 399 and a metal line extending therefrom. In embodiments, the metal within the first recess via 314 is configured or distanced from neighboring plurality of metal lines 391 so as not to short when current is run through the device. Arrows 495 and 495' show the spatial relationship or configuration of the metal material in the first recess via to the neighboring metal lines. In embodiments, arrow 495 shows a distance of between 5 to 10 nanometers between the metal portion of the first recessed via and closest adjacent metal line. In embodiments, arrow 495' shows a distance of between 10 to 15 nanometers between the metal portion of the first recessed via and the next closest adjacent metal line.

FIG. 3F shows an interconnect structure of the present disclosure. In embodiments, the interconnect structure includes a first spacer, second spacer, third spacer and fourth spacer as described above disposed directly atop a top surface of a low-k dielectric layer including a first recessed via and a second recessed via, wherein the second spacer is deposited directly atop the top surface of the low-k dielectric layer and within the first recessed via; at least six metal lines (for example shown as "M") atop the top surface of the low-k dielectric layer, wherein at least two of the six metal lines are adjacent the first spacer, at least one of the six metal lines is adjacent the second spacer, at least one of the metal lines is adjacent the third spacer, and at least two metal lines are adjacent the fourth spacer, at least two metal lines atop the top surface of a first and second tungsten layer within a first and second recessed via, at least two dielectric lines atop the top surface of the low-k-dielectric layer; and at least one dielectric line atop the tungsten layer in the second via. In embodiments, the metal line from the first recessed via is configured to avoid shorts when current is run through the interconnect structure. In some embodiments, the second recessed via includes a portion of a dielectric material line and a second metal line.

Figure 7C:
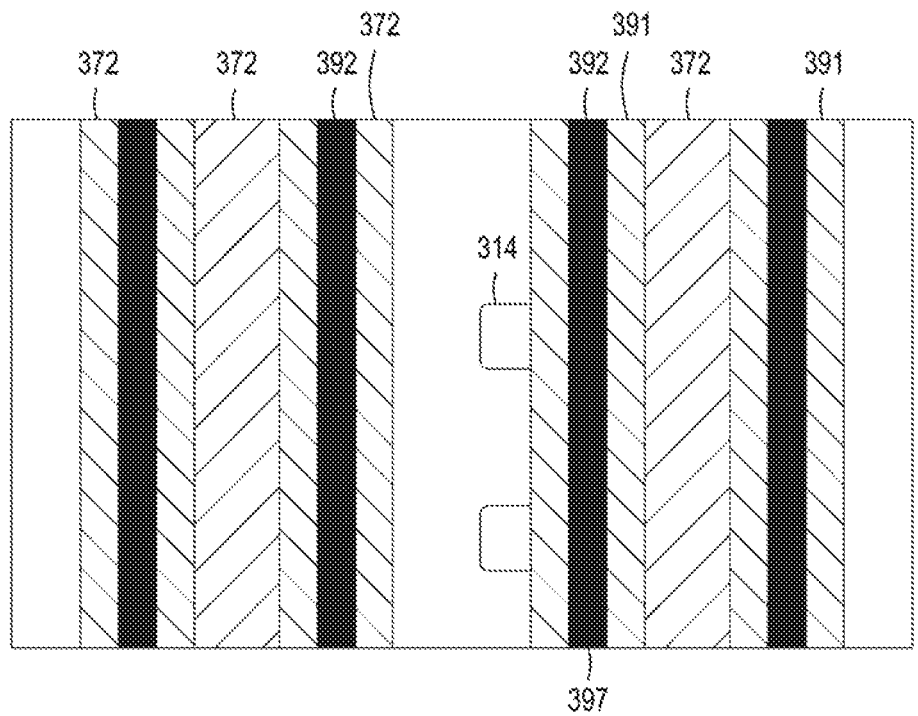

FIG. 7C shows a top down view of a structure formed in accordance with the present disclosure incudes a plurality of metal lines 391, plurality of spacer 392, and plurality of dielectric lines 372 atop the top surface of the low-k dielectric layer. In embodiments, the first recess via 314 includes a portion of the second spacer and metal line extending from the top surface of the metal therein.

Figure 7D:
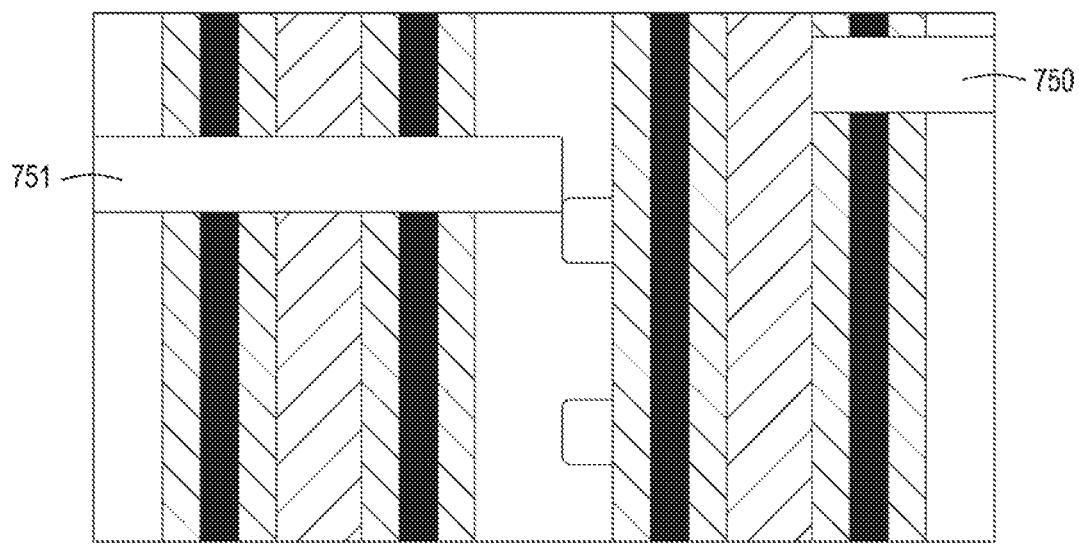

FIG. 7D shows a top down view of a cut mask lithography pattern suitable for use in accordance with the present disclosure including a first cut 750 and a second cut 751 therein.

Figure 5:
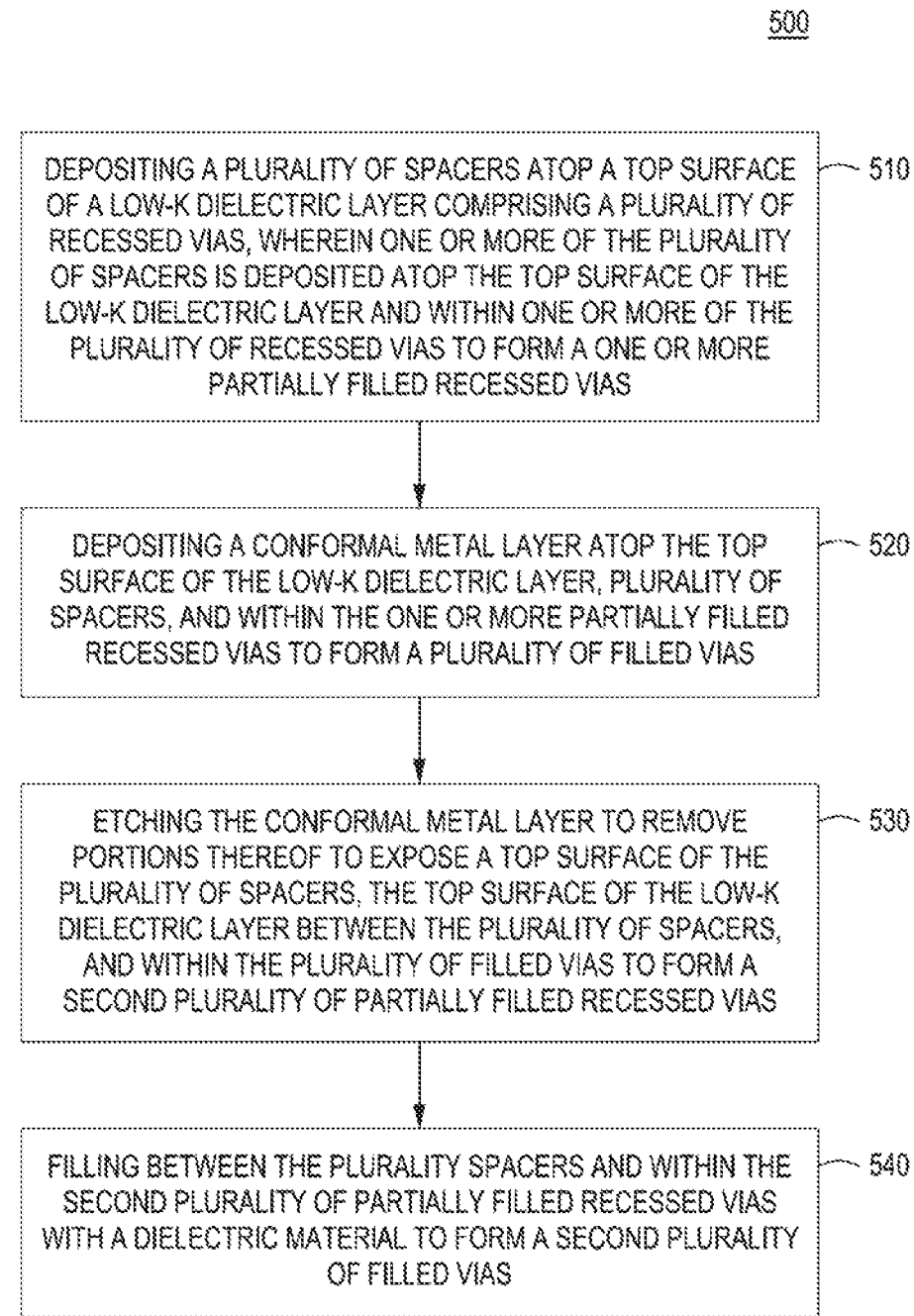
FIG. 5 is a flow diagram of a method of making interconnect structures in accordance with one embodiment of the present disclosure.

Referring now to FIG. 5, a flow diagram of another method of making interconnect structures in accordance with one embodiment of the present disclosure is shown. At 510, the process 500 includes: depositing a plurality of spacers atop a top surface of a low-k dielectric layer comprising a plurality of recessed vias, wherein one or more of the plurality of spacers is deposited atop the top surface of the low-k dielectric layer and within one or more of the plurality of recessed vias to form a one or more partially filled recessed vias. In embodiments, the plurality of spacers is deposited in accordance with methods described above. At 520, the process 500 includes, depositing a conformal metal layer atop the top surface of the low-k dielectric layer, plurality of spacers, and within the one or more partially filled recessed vias to form a plurality of filled vias. In embodiments, the metal layer is deposited in accordance with methods described above. At 530, the process 500 includes etching the conformal metal layer to remove portions thereof to expose a top surface of the plurality of spacers, the top surface of the low-k dielectric layer between the plurality of spacers, and within the plurality of filled vias to form a second plurality of partially filled recessed vias. At 540, the process 500 includes filling between the plurality spacers and within the second plurality of partially filled recessed vias with a dielectric material to form a second plurality of filled vias. In embodiments, the one or more of the second plurality of filled vias comprises one or more metal lines, wherein one or more metal lines are configured to self-align with an adjacent interconnect layer. In some embodiments, the second plurality of filled vias comprise a high aspect ratio and are characterized as having a pitch between 20 to 30 nanometers. In some embodiments, the second plurality of filled vias have a depth of between 15 and 30 nanometers. In some embodiments, the second plurality of filled vias comprise a tungsten metal fill. In some embodiments, the plurality of spacers comprise oxide, silicon nitride, amorphous silicon, or silicon carbonitride. In some embodiments, the conformal metal layer comprises ruthenium, molybdenum, tungsten, cobalt, nickel, rhodium, aluminum, or combinations thereof.

The methods described herein may be performed in individual process chambers that may be provided in a standalone configuration or as part of one or more cluster tools, for example, an integrated tool 600 (i.e., cluster tool) described below with respect to FIG. 6. Examples of the integrated tool 600 include the ENDURA®, CENTURA®, PRODUCER® or CENTRIS™ line of processing systems, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool including the Applied Materials Continuum ALD chamber and Radion ALE chamber. In embodiments, a single chamber may be configured to perform the process sequences of the present disclosure.

The integrated tool 600 can include two load lock chambers 606A, 606B for transferring of substrates into and out of the integrated tool 600. Typically, since the integrated tool 600 is under vacuum, the load lock chambers 606A, 606B may pump down the pressure within the load lock chambers when substrates are introduced into the integrated tool 600. A first robot 610 may transfer the substrates between the load lock chambers 606A, 606B, and a first set of one or more substrate processing chambers 612, 614, 616, 618 (four are shown) coupled to a first transfer chamber 650. Each substrate processing chamber 612, 614, 616, 618, can be outfitted to perform a number of substrate processing operations. In some embodiments, the first set of one or more substrate processing chambers 612, 614, 616, 618 may include any combination of PVD, ALD, CVD, ALE, etch, degas, or pre-clean chambers. For example, in some embodiments, the processing chambers, 612, 614, 616, 618 include two pre-clean chambers and two degas chambers.

The first robot 610 can also transfer substrates to/from two intermediate transfer chambers 622, 624. The intermediate transfer chambers 622, 624 can be used to maintain ultrahigh vacuum conditions while allowing substrates to be transferred within the integrated tool 600. A second robot 630 can transfer the substrates between the intermediate transfer chambers 622, 624 and a second set of one or more substrate processing chambers 632, 634, 635, 636, 638 coupled to a second transfer chamber 655. The substrate processing chambers 632, 634, 635, 636, 638 can be outfitted to perform a variety of substrate processing operations including the methods described above in addition to, physical vapor deposition processes (PVD), chemical vapor deposition (CVD), etching, orientation and other substrate processes. In some embodiments, the second set of one or more substrate processing chambers 632, 634, 635, 636, 638 may include any combination of etch chambers (ALE) configured to etch the metal layer of the present disclosure, deposition chambers configured to deposit tungsten or metal layer metals as described above. For example, in some embodiments, the substrate processing chambers 632, 634, 635, 636, 638 include at least two etch chambers (ALE) configured to etch the metal layer in accordance with the present disclosure, at least two CVD chamber configured to deposit metal such as ALD metal deposition, and at least one chamber configured to deposit spacers in accordance with the present disclosure. Any of the substrate processing chambers 612, 614, 616, 618, 632, 634, 635, 636, 638 may be removed from the integrated tool 600 if not necessary for a particular process to be performed by the integrated tool 600.

Figure 6:
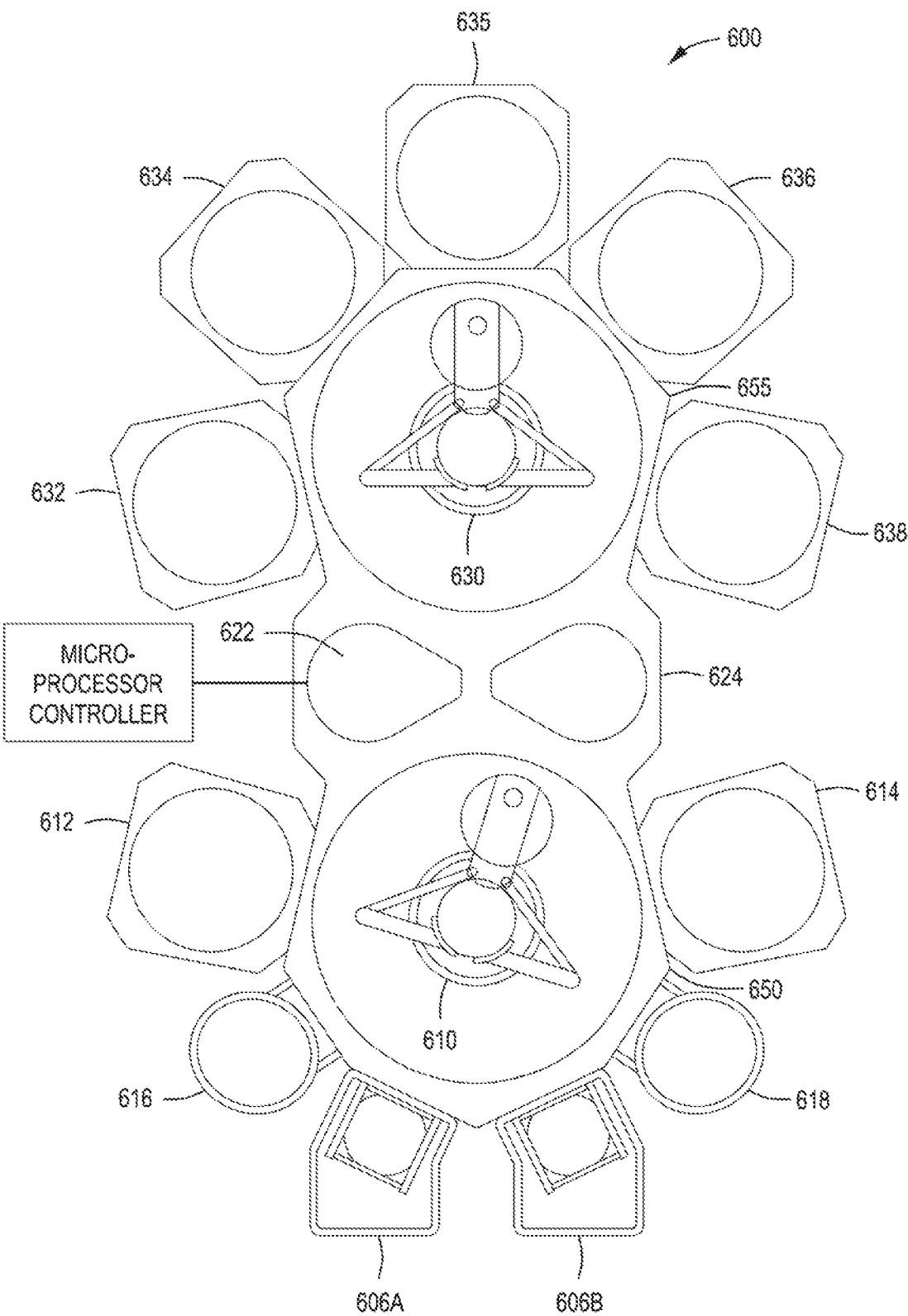
FIG. 6 depicts a cluster tool suitable for making interconnect structures in accordance with one embodiment of the present disclosure.

In embodiments, FIG. 6 refers to an integrated tool 600 such as a cluster tool, including: a first transfer chamber 650 and a second transfer chamber 655; an atomic layer etching (ALE) chamber as substrate processing chamber 632 configured to etch a first metal coupled to the second transfer chamber 655 (however an atomic layer etching (ALE) chamber as substrate processing chamber 632 configured to etch a first metal may be coupled to the first transfer chamber 650); and a chemical vapor deposition (CVD) chamber such as substrate processing chamber 634 configured to deposit a second metal or second layer of metal coupled to the first transfer chamber or second transfer chamber. In embodiments, the cluster tool or integrated tool 600 is configured to transfer from the atomic layer etching (ALE) chamber such as substrate processing chamber 632 to the chemical vapor deposition (CVD) chamber such as substrate processing chamber 634 without oxygen.

In one embodiment, a cluster tool includes one chamber suitable to deposit spacer material as described herein, a chamber suitable to etch the spacer material as described herein, a chamber suitable for depositing a metal layer in accordance with the present disclosure such as a metal ALD deposition chamber, ALE direction treatment chamber, and/or an ALE selective etch chamber suitable to etch the metal layer as described above. A chamber may also be provided configured for filling the first gap, second gap, and third gap with a dielectric material in order to form a pattern wherein a metal line extends from the first recessed via, and wherein the metal line contacts the top surface of the metal fill within the first recessed via.

In embodiments, the cluster tool includes one chamber, such as an ALD chamber configured for depositing a first spacer, second spacer, third spacer and fourth spacer atop a top surface of a low-k dielectric layer comprising a first recessed via and a second recessed via, wherein the second spacer is deposited atop the top surface of the low-k dielectric layer and within the first recessed via. In embodiments, the cluster tool includes a chamber such as an ALD chamber configured to conformally depositing a metal layer atop the top surface of the low-k dielectric layer, the first spacer, the second spacer, the third spacer, the fourth spacer, and within first recessed via and the second recessed via to form a first covered spacer, a second covered spacer, a third covered spacer, and a fourth covered spacer, wherein the first recessed via is filled with the metal layer and the second spacer. In embodiments, the cluster tool includes one chamber, such as an ALE etch chamber configured for etching the metal layer to expose the top surface of the first spacer, the top surface of the second spacer, the top surface of the third spacer, the top surface of the fourth spacer, a top surface of the dielectric layer between the first covered spacer and the second covered spacer, a top surface of the dielectric layer between the second covered spacer and the third covered spacer, a top surface of the dielectric layer between the third covered spacer and the fourth covered spacer. In embodiments the chamber is configured for etching a first gap between the between the first covered spacer and the second covered spacer, a second gap between the second covered spacer and the third covered spacer, a third gap between the third covered spacer and the fourth covered spacer, wherein the third gap extends into the second recessed via exposing the top surface of a metal layer therein. In embodiments, the cluster tool includes one chamber, for filling the first gap, second gap, and third gap with a dielectric material to form a pattern wherein a metal line extends from the first recessed via, and wherein the metal line contacts the top surface of the metal fill within the first recessed via.

In embodiments, a single chamber is configured to form structures in accordance with the present disclosure. In embodiments, a single chamber may include a plurality of pedestals, such as four pedestals configured to perform the process sequences of the present disclosure. In embodiments, a single chamber is configured to form a metal spacer in a layer by layer formation process. In embodiments, a single chamber is configured to form an interconnect structure, by one or more of: (a) depositing a plurality of spacers atop a top surface of a low-k dielectric layer including a plurality of recessed vias, wherein one or more of the plurality of spacers is deposited atop the top surface of the low-k dielectric layer and within one or more of the plurality of recessed vias to form a one or more partially filled recessed vias; (b) etching the deposited plurality of spacers; (c) depositing a conformal metal layer atop the top surface of the low-k dielectric layer (such as by ALD), plurality of spacers, and within the one or more partially filled recessed vias to form a plurality of filled vias; (d) etching the conformal metal layer to remove portions thereof to expose a top surface of the plurality of spacers, the top surface of the low-k dielectric layer between the plurality of spacers, and within the plurality of filled vias to form a second plurality of partially filled recessed vias; (e) repeating (c) and (d) a plurality of times until the plurality of spacer have a desired thickness of metal upon the sidewalls thereof; and (f) filling between the plurality spacers and within the second plurality of partially filled recessed vias with a dielectric material to form a second plurality of filled vias. In embodiments, process sequences (a)-(f) may be cyclically repeated. In some embodiments, a single chamber is configured to perform an ALD metal deposition, treat (such as by oxygen plasma reaction), etch and anneal the deposited metal as described herein. In embodiments, a single chamber is configured to deposit a plurality of spacers, etch the plurality of spacers, deposit metal atop the spacers and on the side of the spacers, etch the metal. The metal deposition and etching may be cyclically repeated to sufficiently form metal only atop the sidewall of the spacers. In embodiments, the single chamber may also be configured to fill between the spacers with a dielectric material.

In some embodiments, the integrated tool and/or chamber includes a rotating platform and up to four zones for: (a) deposition of ALD metal (e.g., Ru, Mo, Ir, Rh, Co); (b) $O_2$ for Rutheinism, $Cl_2$ for molybdenum plasma treat; (c) selectively etching metal oxide, chloride; and (d) annealing the metal to remove impurity and large grain. The integrated tool and/or single chamber is configured to form structures in accordance with the present disclosure. For example, in embodiments, the integrated tool and or chamber is configured to form a metal spacer in a layer by layer formation process. In embodiments, a very thin (such as 3-10 angstroms) of ALD metal is deposited conformably over dielectric (hardmask or spacer), followed by directional treatment (forming metal oxide, chloride, nitride of top and bottom metal), followed by selective removal etch of the reacted metal oxide or chloride and anneal. In embodiments, the methodology described herein results in about a 3-10 angstroms sidewall spacer in each cycle. In embodiments the cycle (a-d) is repeated to end up with final metal spacer width of 80 angstroms to 200 angstroms (8 nm to 20 nm) which, in embodiments, is a targeted interconnect width.

In another embodiment, a non-transitory computer readable medium having instructions stored thereon that, when executed, cause a method forming an interconnect structure, within or processed through an integrated tool, includes: depositing a plurality of spacers atop the top surface of a low-k dielectric layer comprising a plurality of recessed vias, wherein one or more of the plurality of spacers is deposited atop the top surface of the low-k dielectric layer and within one or more of the plurality of recessed vias to form a plurality of partially filled recessed vias; depositing a conformal metal layer atop the top surface of the low-k dielectric layer, plurality of spacers, and within the a plurality of partially filled recessed vias to form a plurality of filled vias; etching the conformal metal layer to remove portions thereof to expose a top surface of the plurality of spacers, the top surface of the dielectric layer between the plurality of spacers, and within the plurality of filled vias to form a second plurality of partially filled recessed vias; and filling between the plurality spacers and within the second plurality of partially filled recessed vias with a dielectric material to form a plurality of second plurality of filled vias.

In another embodiment, a non-transitory computer readable medium having instructions stored thereon that, when executed, cause a method forming an interconnect structure, within or processed through an integrated tool, includes: depositing a first spacer, second spacer, third spacer and fourth spacer atop a top surface of a low-k dielectric layer comprising a first recessed via and a second recessed via, wherein the second spacer is deposited atop the top surface of the low-k dielectric layer and within the first recessed via; conformally depositing a metal layer atop the top surface of the low-k dielectric layer, the first spacer, the second spacer, the third spacer, the fourth spacer, and within first recessed via and the second recessed via to form a first covered spacer, a second covered spacer, a third covered spacer, and a fourth covered spacer, wherein the first recessed via is filled with the metal layer and the second spacer; etching the metal layer to expose the top surface of the first spacer, the top surface of the second spacer, the top surface of the third spacer, the top surface of the fourth spacer, a top surface of the dielectric layer between the first covered spacer and the second covered spacer, a top surface of the dielectric layer between the second covered spacer and the third covered spacer, a top surface of the dielectric layer between the third covered spacer and the fourth covered spacer, wherein the etching forms a first gap between the between the first covered spacer and the second covered spacer, a second gap between the second covered spacer and the third covered spacer, a third gap between the third covered spacer and the fourth covered spacer, wherein the third gap extends into the second recessed via exposing the top surface of a metal layer therein; and filling the first gap, second gap, and third gap with a dielectric material to form a pattern wherein a metal line extends from the first recessed via, and wherein the metal line contacts the top surface of the metal fill within the first recessed via.

Figure 8:
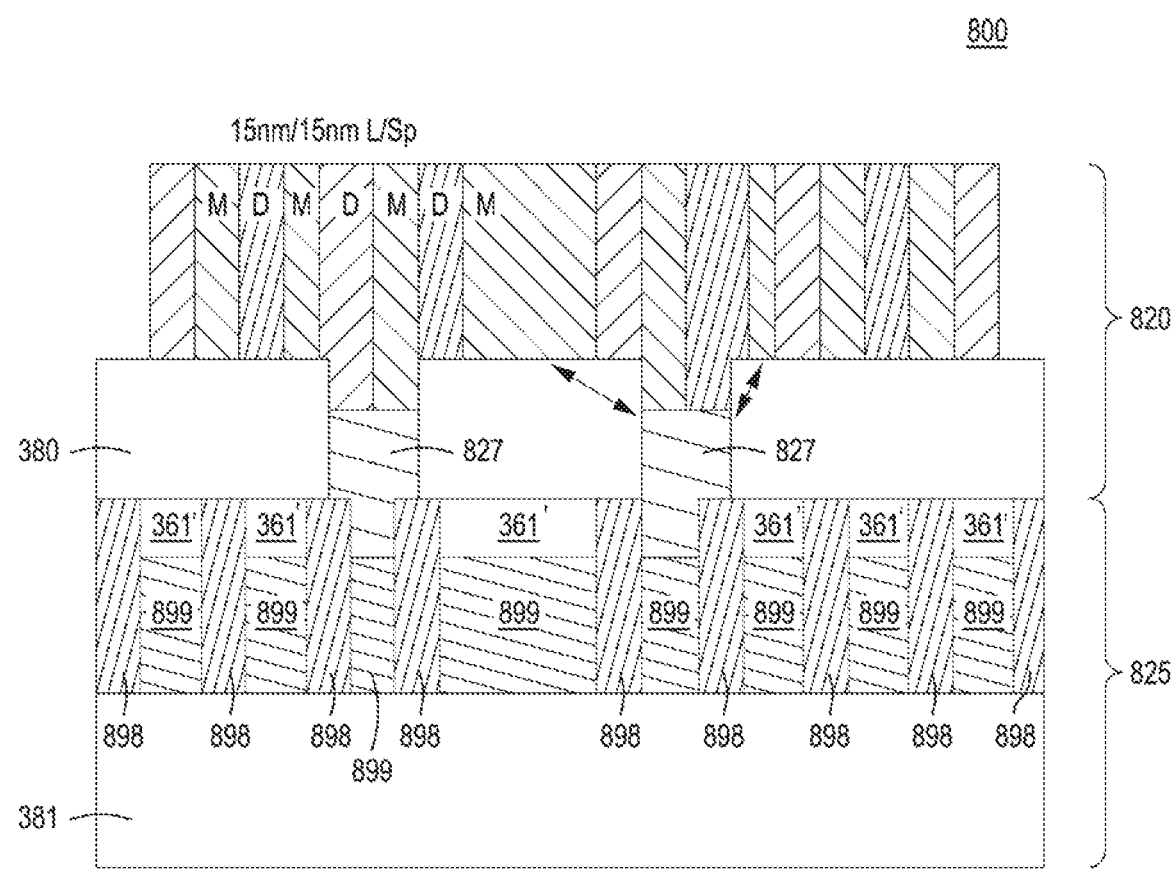
FIG. 8 is a schematic, cross-sectional side view of an interconnect structure embodiment of the present disclosure.

Referring now to FIG. 8, an interconnect device in accordance with the present disclosure is shown. In embodiments, device 800 includes aligned interconnect layers such as two or more layers. In embodiments, a first interconnect layer incudes layer 820 which, in embodiments, may be the same device as shown and described herein above in FIG. 3F. An additional interconnect layer such as interconnect layer 825 is an adjacent layer or positioned immediately adjacent to layer 820. In embodiments, interconnect device includes a plurality of vias and, in embodiments the vias are characterized as self-aligning. Interconnect layer 825 may comprise a second low-k dielectric layer 826, and a plurality of vias 827. In embodiments, the additional interconnect layer such as interconnect layer 825 includes a plurality of low-k dielectric areas 361' adjacent to the low-k dielectric material 380 of the first interconnect layer 820. In embodiments the low-k dielectric material 380 in the first interconnect layer and the plurality of low-k dielectric areas 361' are identical or the same material. In embodiments, the low-k dielectric material 380 in the first interconnect layer and the plurality of low-k dielectric areas 361', and low-k dielectric material 381 of the interconnect layer 825 are identical or the same material. In embodiments, interconnect layer 825, includes a plurality of metal portions 899 adjacent to a plurality of dielectric lines 898.

While the foregoing is directed to embodiments of the present disclosure, other and further embodiments of the disclosure may be devised without departing from the basic scope thereof.

The invention claimed is:

1. A method of forming an interconnect structure, the method comprising:
    depositing a plurality of spacers atop a top surface of a low-k dielectric layer comprising a plurality of recessed vias, wherein one or more of the plurality of spacers is deposited atop the top surface of the low-k dielectric layer and within one or more of the plurality of recessed vias to form a one or more partially filled recessed vias;
    depositing a conformal metal layer atop the top surface of the low-k dielectric layer, plurality of spacers, and within the one or more partially filled recessed vias to form a plurality of filled vias;
    etching the conformal metal layer to remove portions thereof to expose a top surface of the plurality of spacers, the top surface of the low-k dielectric layer between the plurality of spacers, and within the plurality of filled vias to form a second plurality of partially filled recessed vias; and
    filling between the plurality spacers and within the second plurality of partially filled recessed vias with a dielectric material to form a second plurality of filled vias.

2. The method of claim 1, wherein one or more of the second plurality of filled vias comprises one or more metal lines, wherein one or more metal lines are configured to self-align with an adjacent interconnect layer.

3. The method of claim 1, wherein the second plurality of filled vias comprise a high aspect ratio and are characterized as having a pitch between 20 to 30 nanometers.

4. The method of claim 1, wherein the second plurality of filled vias have a depth of between 15 and 30 nanometers.

5. The method of claim 1, wherein the second plurality of filled vias comprise a tungsten metal fill.

6. The method of claim 1, wherein the plurality of spacers comprise oxide, silicon nitride, amorphous silicon, or silicon carbonitride.

7. The method of claim 1, wherein the conformal metal layer comprises ruthenium, molybdenum, tungsten, cobalt, nickel, rhodium, aluminum, or combinations thereof.

8. A method of forming an interconnect structure, the method comprising:
    depositing a first spacer, second spacer, third spacer and fourth spacer atop a top surface of a low-k dielectric layer comprising a first recessed via and a second recessed via, wherein the second spacer is deposited atop the top surface of the low-k dielectric layer and within the first recessed via;
    conformally depositing a metal layer atop the top surface of the low-k dielectric layer, the first spacer, the second spacer, the third spacer, the fourth spacer, and within first recessed via and the second recessed via to form a first covered spacer, a second covered spacer, a third covered spacer, and a fourth covered spacer, wherein the first recessed via is filled with the metal layer and the second spacer;
    etching the metal layer to expose the top surface of the first spacer, the top surface of the second spacer, the top surface of the third spacer, the top surface of the fourth spacer, a top surface of the low-k dielectric layer between the first covered spacer and the second covered spacer, a top surface of the dielectric layer between the second covered spacer and the third covered spacer, a top surface of the dielectric layer between the third covered spacer and the fourth covered spacer, wherein the etching forms a first gap between the between the first covered spacer and the second covered spacer, a second gap between the second covered spacer and the third covered spacer, a third gap between the third covered spacer and the fourth covered spacer, wherein the third gap extends into the second recessed via exposing the top surface of a metal layer therein; and
    filling the first gap, second gap, and third gap with a dielectric material to form a pattern wherein a metal line extends from the first recessed via, and wherein the metal line contacts the top surface of a metal fill within the first recessed via.

9. The method of claim 8, wherein the first recessed via comprises a portion of the second spacer and a portion of the metal line.

10. The method of claim 8, wherein the second recessed via comprises a portion of a dielectric material line and a second metal line.

11. The method of claim 8, wherein in first recessed via and the second recessed via have a pitch between 20 to 30 nanometers.

12. The method of claim 8, further comprising, prior to depositing a first spacer, providing a low-k dielectric layer comprising a first recessed via, a first hardmask and first resist forming a first patterning portion, a second hardmask and a second resists forming a second patterning portion, wherein the first patterning portion is atop the low-k dielectric layer and adjacent the first recessed via with a space there between.

13. The method of claim 8, wherein the first recessed via and second recessed via are partially filled with tungsten.

14. The method of claim 8, wherein the first spacer, second spacer, third spacer, and fourth spacer comprise oxide, silicon nitride, amorphous silicon, or silicon carbonitride.

15. The method of claim 8, wherein the metal layer comprises ruthenium, molybdenum, tungsten, cobalt, nickel, rhodium, aluminum, or combinations thereof.

16. The method of claim 8, wherein etching the metal layer comprises atomic layer etching.

17. The method of claim 8, wherein the interconnect structure contacts a second interconnect structure comprising at least one via, wherein the first recessed via or second recessed via is configured to self-align with the at least one via.

18. A non-transitory computer readable medium having instructions stored thereon that, when executed, cause a method of forming an interconnect structure in an integrated tool, comprising:

depositing a plurality of spacers atop a top surface of a low-k dielectric layer comprising a plurality of recessed vias, wherein one or more of the plurality of spacers is deposited atop the top surface of the low-k dielectric layer and within one or more of the plurality of recessed vias to form a one or more partially filled recessed vias;

depositing a conformal metal layer atop the top surface of the low-k dielectric layer, plurality of spacers, and within the one or more partially filled recessed vias to form a plurality of filled vias;

etching the conformal metal layer to remove portions thereof to expose a top surface of the plurality of spacers, the top surface of the dielectric layer between the plurality of spacers, and within the plurality of filled vias to form a second plurality of partially filled recessed vias; and filling between the plurality spacers and within the second plurality of partially filled recessed vias with a dielectric material to form a second plurality of filled vias.

19. The non-transitory computer readable medium of 18, wherein second plurality of filled vias comprises one or more metal lines, wherein one or more metal lines are configured to self-align with an adjacent interconnect layer.

20. The non-transitory computer readable medium of 18, wherein depositing a conformal metal layer atop a top surface of a low-k dielectric layer is performed in a cycle with etching the conformal metal layer.

* * * * *